United States Patent
Kitano et al.

(10) Patent No.: US 12,280,502 B2
(45) Date of Patent: Apr. 22, 2025

(54) ROBOT TEACHING DEVICE AND ROBOT TEACHING PROGRAM

(71) Applicant: KAWASAKI JUKOGYO KABUSHIKI KAISHA, Kobe (JP)

(72) Inventors: Shinya Kitano, Kobe (JP); Kazuo Fujimori, Kobe (JP); Yukihiro Kawaguchi, Kobe (JP)

(73) Assignee: KAWASAKI JUKOGYO KABUSHIKI KAISHA, Kobe (JP)

(*) Notice: Subject to any disclaimer, the term of this patent is extended or adjusted under 35 U.S.C. 154(b) by 227 days.

(21) Appl. No.: 18/013,150

(22) PCT Filed: Jun. 15, 2021

(86) PCT No.: PCT/JP2021/022644
§ 371 (c)(1),
(2) Date: Dec. 27, 2022

(87) PCT Pub. No.: WO2021/261325
PCT Pub. Date: Dec. 30, 2021

(65) Prior Publication Data
US 2023/0241769 A1 Aug. 3, 2023

(30) Foreign Application Priority Data
Jun. 26, 2020 (JP) .................. 2020-110186

(51) Int. Cl.
*B25J 9/16* (2006.01)
*B65G 47/90* (2006.01)

(52) U.S. Cl.
CPC ............ *B25J 9/163* (2013.01); *B65G 47/905* (2013.01)

(58) Field of Classification Search
CPC ........ B25J 9/163; B25J 9/1656; B25J 9/1664; B25J 13/02; B65G 47/905;
(Continued)

(56) References Cited

U.S. PATENT DOCUMENTS

2017/0170050 A1* 6/2017 Yoshida ............ H01L 21/67706
2018/0236657 A1 8/2018 Kuwahara et al.
(Continued)

FOREIGN PATENT DOCUMENTS

JP H10-124132 A 5/1998
JP 2018-134703 A 8/2018
(Continued)

*Primary Examiner* — Ian Jen
*Assistant Examiner* — Renee LaRose
(74) *Attorney, Agent, or Firm* — Oliff PLC (57) ABSTRACT

A teaching device is a teaching device for a robot including a base, an arm having a plurality of links coupled to each other and coupled to the base, and a hand coupled to the arm. The teaching device includes a setter that sets a predetermined condition including start and end points of the hand in predetermined movement of the arm; a deriver that derives a movement trajectory of the hand from the start point to the end point and a movement trajectory of the arm according to the movement trajectory of the hand based on the predetermined condition; a display that displays at least one of the movement trajectory of the arm or the movement trajectory of the hand, the movement trajectories being derived by the deriver; and a corrector that corrects the movement trajectory displayed on the display according to user's input operation.

8 Claims, 7 Drawing Sheets

(58) Field of Classification Search
CPC .. G05B 2219/2602; G05B 2219/45031; G05B 19/425; H01L 21/677
See application file for complete search history.

(56) References Cited

U.S. PATENT DOCUMENTS

2018/0299874 A1* 10/2018 Nobuhara .............. B25J 9/1664
2018/0311825 A1* 11/2018 Yamamoto ............ B25J 9/1656

FOREIGN PATENT DOCUMENTS

| | | |
|---|---|---|
| JP | 2018-144228 A | 9/2018 |
| JP | 2018-176372 A | 11/2018 |
| JP | 6526098 B2 | 6/2019 |
| JP | 2019-193975 A | 11/2019 |

* cited by examiner

ROBOT TEACHING DEVICE AND ROBOT TEACHING PROGRAM

FIELD

The present application relates to a robot teaching device and a robot teaching program.

BACKGROUND

Typically, a teaching device for teaching predetermined movement to a robot has been known. For example, a teaching device (an operation device) disclosed in Patent Document 1 reproduces movement of a robot model on a touch screen based on a movement trajectory obtained from set start and end points, thereby checking movement of the robot model. After checking, in a case where a user has determined that such movement is improper, such movement is canceled.

CITATION LIST

Patent Document

Patent Document 1: Japanese Patent No. 6526098

SUMMARY OF THE INVENTION

However, in the above-described teaching device, even if, e.g., it has been determined that only part of movement (the movement trajectory) of the robot model is improper, the entirety of such movement (the movement trajectory) is canceled, and for this reason, it is not easy to perform fine correction according to a user's intention.

The technique disclosed in the present application has been made in view of the above-described situation, and an object thereof is to provide a teaching device capable of finely and easily correcting a movement trajectory of a robot according to a user's intention.

The technique disclosed in the present application is a teaching device for a robot including a base, an arm having a plurality of links coupled to each other and coupled to the base, and an end effector coupled to the arm. The teaching device for the robot includes a setter, a deriver, a display, and a corrector. The setter sets a predetermined condition including start and end points of the end effector in predetermined movement of the arm. The deriver derives a movement trajectory of the end effector from the start point to the end point and a movement trajectory of the arm according to the movement trajectory of the end effector based on the predetermined condition. The display displays at least one of the movement trajectory of the arm or the movement trajectory of the end effector, the movement trajectories being derived by the deriver. The corrector corrects the movement trajectory displayed on the display according to user's input operation.

Another technique disclosed in the present application is a teaching program for a robot including a base, an arm having a plurality of links coupled to each other and coupled to the base, and an end effector coupled to the arm. The teaching program for the robot causes a computer to execute a function of setting a predetermined condition including start and end points of the end effector in predetermined movement of the arm, a function of deriving a movement trajectory of the end effector from the start point to the end point and a movement trajectory of the arm according to the movement trajectory of the end effector based on the predetermined condition, a function of displaying, on a display, at least one of the derived movement trajectory of the arm or the derived movement trajectory of the end effector, and a function of correcting the movement trajectory displayed on the display according to user's input operation.

According to the above-described robot teaching device, the movement trajectory of the robot (the arm and the end effector) can be finely and easily corrected according to the user's intention.

According to the above-described robot teaching program, the movement trajectory of the robot (the arm and the end effector) can be finely and easily corrected according to the user's intention.

DESCRIPTION OF EMBODIMENTS

Hereinafter, an exemplary embodiment will be described in detail based on the drawings.

Figure 1:
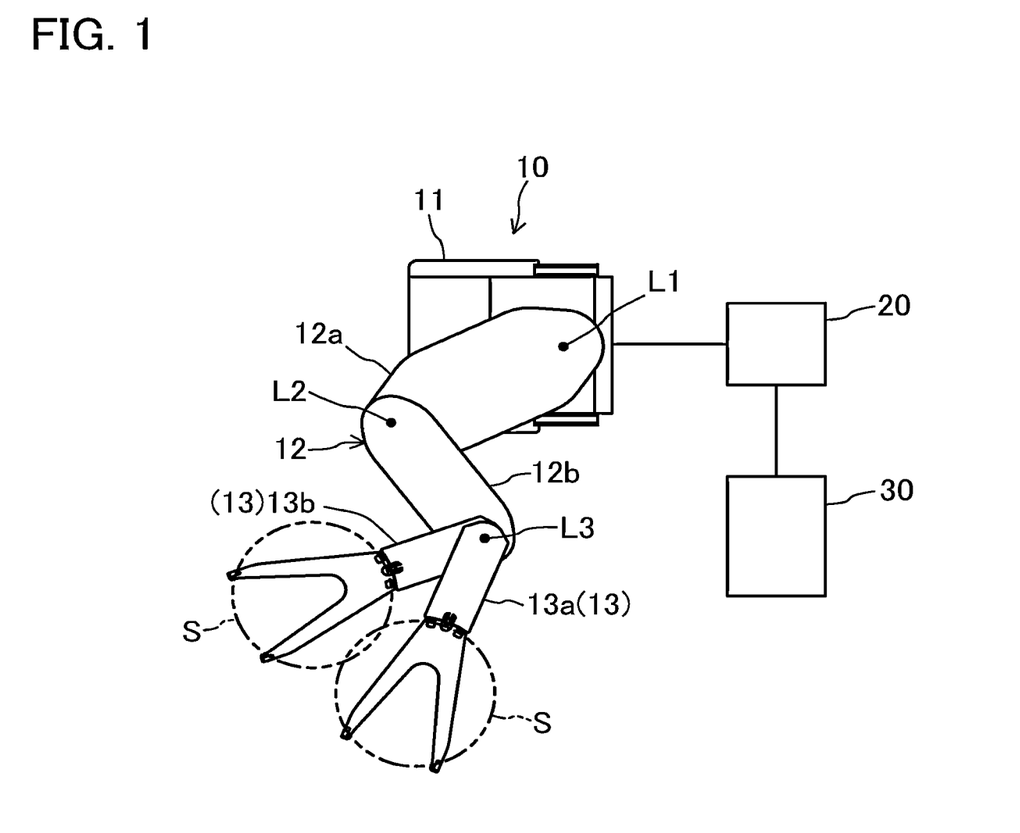
FIG. 1 is a view schematically showing a teaching device and a robot.

As shown in FIG. 1, a teaching device 30 of the present embodiment is communicably connected to a robot control device 20, and the robot control device 20 is communicably connected to a robot 10. The teaching device 30 is a device for teaching predetermined movement to the robot 10.

The robot 10 shown in FIG. 1 is one example of a robot as a target of the teaching device 30. The robot 10 is a horizontal articulated robot (a SCARA robot). The robot 10 has a base 11, an arm 12 having a plurality of links 12*a*, 12*b* coupled to each other and coupled to the base 11, and hands 13 coupled to the arm 12. The arm 12 is coupled to the base 11 so as to rotate in the horizontal direction. The hand 13 is one example of an end effector.

The arm 12 of the present embodiment includes two links 12*a*, 12*b*. Two links 12*a*, 12*b* are coupled to each other so as to rotate in the horizontal direction. Two links 12*a*, 12*b* are in this order from a base 11 side. The link 12*a* is coupled to the base 11 so as to rotate about a first axis L1 extending in the vertical direction. The link 12*b* is coupled to the link 12*a* so as to rotate about a second axis L2 extending in the vertical direction.

The robot 10 has two hands 13, i.e., an upper hand 13*a* and a lower hand 13*b*. The upper hand 13*a* and the lower hand 13*b* have the same basic configuration. The hand 13 is in a plate shape extending in the horizontal direction, and on a tip end side thereof, is in a forked shape. That is, the hand 13 is substantially in a Y-shape as viewed in a thickness direction thereof. The upper hand 13a and the lower hand 13b are coupled to the second link 12b so as to rotate in the horizontal direction about a third axis L3 extending in the vertical direction. The first axis L1, the second axis L2, and the third axis L3 extend parallel with each other.

The first link 12a, the second link 12b, the upper hand 13a, and the lower hand 13b are stacked on each other in this order from the bottom to the top. Although not shown in the figure, the robot 10 has a plurality of motors that rotatably drives two links 12a, 12b and two hands 13. The robot 10 of the present embodiment delivers a target (a substrate S) with the target being on an upper surface of the hand 13 in an unfixed manner. That is, the target is merely on the upper surface of the hand 13, and is not held by the hand 13.

Figure 6:
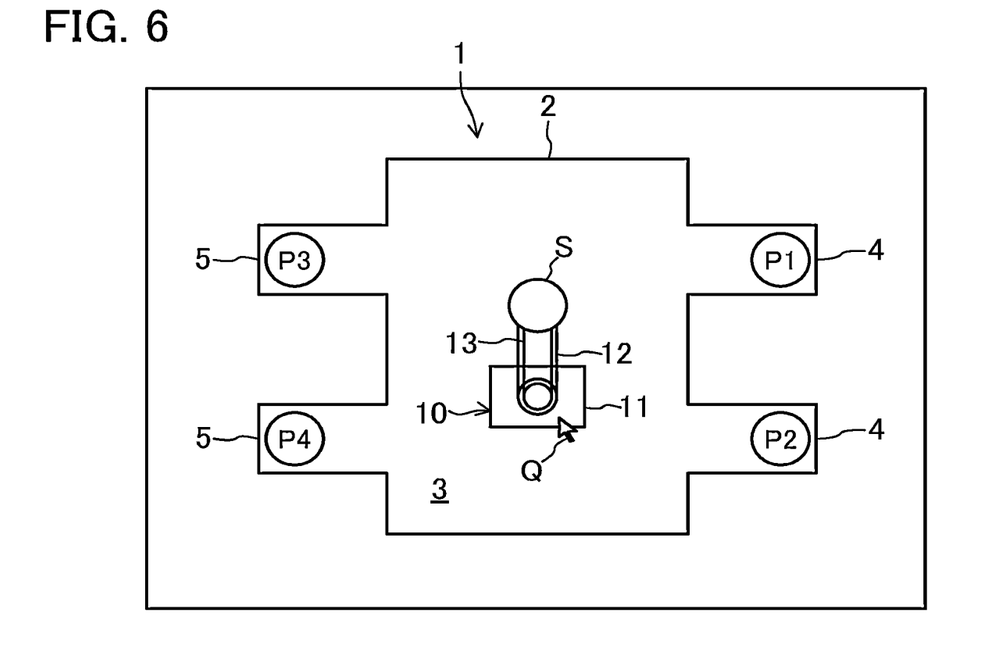
FIG. 6 is a view showing one example of the image displayed on the display.

The robot 10 of the present embodiment is, for example, used for a substrate delivery system 1 that delivers the substrate S. An outline configuration of the substrate delivery system 1 will be described with reference to FIG. 6 schematically showing the substrate delivery system 1.

The substrate delivery system 1 includes a housing 2, and the robot 10 is in the housing 2. The substrate delivery system 1 is, for example, an equipment front end module (EFEM). The housing 2 is substantially in a rectangular parallelepiped shape. The inside of the housing 2 is a cleaned delivery space 3. That is, the robot 10 delivers the substrate S in the delivery space 3. For example, the substrate S is a discoid semiconductor wafer.

The substrate delivery system 1 includes a plurality (two in the present embodiment) of front opening unified pods (FOUPs) 4 and a plurality (two in the present embodiment) of processing devices 5. The plurality of FOUPs 4 is adjacent to one side wall of the housing 2. The plurality of processing devices 5 is adjacent to a side wall of the housing 2 facing the side wall to which the FOUPs 4 are adjacent. The FOUPs 4 and the processing devices 5 are outside the housing 2, and the inside thereof can communicate with the inside (the delivery space 3) of the housing 2. The FOUP 4 houses a plurality of substrates S in the horizontal posture at equal intervals in the vertical direction. The processing device 5 is a processing device that performs various types of processing such as heat treatment, impurity introduction, and thin film formation for the substrate S.

In the substrate delivery system 1 configured as described above, the robot 10 delivers the substrate S between the FOUP 4 housing the substrates S and the processing device 5 processing the substrate S. That is, the arm 12 and the hand 13 deliver the substrate S between the FOUP 4 and the processing device 5.

<Configuration of Teaching Device>

Figure 2:
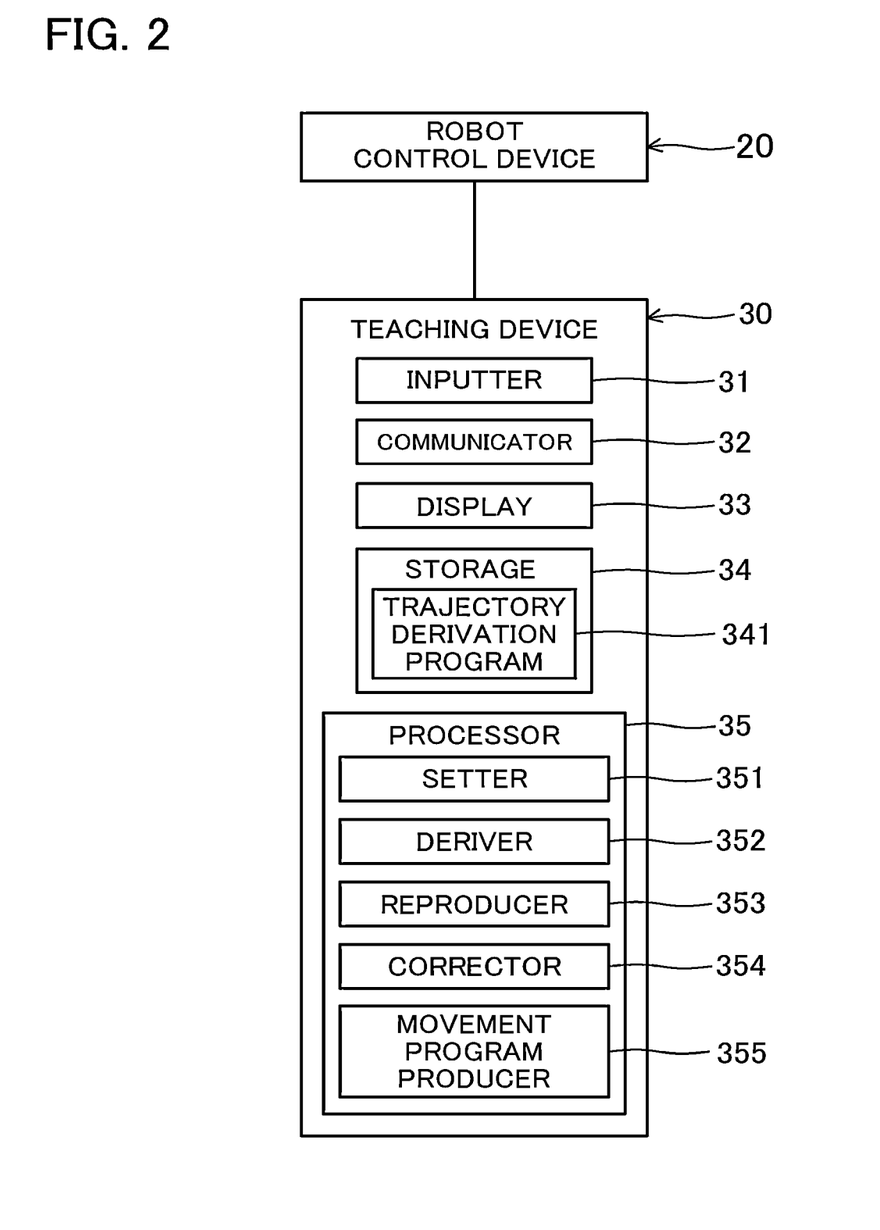
FIG. 2 is a block diagram showing the configuration of the teaching device.

As shown in FIG. 2, the teaching device 30 includes an inputter 31, a communicator 32, a display 33, a storage 34, and a processor 35.

The inputter 31 receives input operation from a user. The inputter 31 outputs an input signal corresponding to the input operation to the processor 35. For example, the inputter 31 is a keyboard or a mouse.

The communicator 32 is an interface that communicates with the robot control device 20. For example, the communicator 32 is a cable modem, a software modem, or a wireless modem.

The display 33 displays at least one of a movement trajectory of the arm 12 or a movement trajectory of the hand 13, the movement trajectories being derived by the later-described processor 35 (a deriver 352). Further, the display 33 also displays a robot model of the robot 10. The display 33 is, for example, a liquid crystal display or an organic EL display.

The storage 34 is a computer readable storage medium that stores various programs and various types of data. The storage 34 is a magnetic disk such as a hard disk, an optical disk such as a CD-ROM or a DVD, or a semiconductor memory.

The storage 34 stores a trajectory derivation program 341 etc. The trajectory derivation program 341 is a teaching program causing a computer, i.e., the processor 35, to implement various functions of deriving an optimal movement trajectory of the hand 13 and an optimal movement trajectory of the arm 12 (i.e., the links 12a, 12b) according to the movement trajectory of the hand 13 based on a given predetermined condition. The trajectory derivation program 341 is read and executed by the processor 35. The trajectory derivation program 341 is, for example, built based on a genetic algorithm.

The processor 35 has various processors such as a central processing unit (CPU), a graphics processing unit (GPU), and/or a digital signal processor (DSP), and various semiconductor memories such as a random access memory (RAM) and/or a read only memory (ROM). The processor 35 reads, e.g., the trajectory derivation program 341 from the storage 34, thereby implementing various functions of deriving the optimal movement trajectories of the arm 12 and the hand 13. The processor 35 has, as functional blocks, a setter 351, the deriver 352, a reproducer 353, a corrector 354, and a movement program producer 355.

The setter 351 sets the predetermined condition (hereinafter also referred to as a movement condition) including start and end points of the hand 13 in predetermined movement of the arm 12. Specifically, the setter 351 receives, from the inputter 31, the input signal corresponding to the user's input operation and indicating the movement condition, thereby setting the movement condition.

The deriver 352 derives, based on the predetermined condition (the movement condition), the movement trajectory of the hand 13 from the start point to the end point and the movement trajectory of the arm 12 according to the movement trajectory of the hand 13. More specifically, the deriver 352 derives, based on the movement condition set by the setter 351, the movement trajectory of the hand 13 from the start point to the end point and the movement trajectory of the arm 12 according to the movement trajectory of the hand 13 while changing the position of the base 11. That is, the deriver 352 derives the movement trajectories of the hand 13 and the arm 12 matching the movement condition, taking the position of the base 11 as one parameter. The deriver 352 reads the trajectory derivation program 341 from the storage 34, thereby deriving the movement trajectories of the hand 13 etc.

The reproducer 353 causes the robot model to move on the display 33 based on the movement trajectory derived by the deriver 352. Specifically, the reproducer 353 causes an arm and a hand of the robot model based on the movement trajectory of the hand 13 or the arm 12 displayed on the display 33. That is, the reproducer 353 may cause the robot model on the display 33 to move based on the movement trajectory derived by the deriver 352, or may cause the robot model on the display 33 to move based on a movement trajectory corrected by the later-described corrector 354.

The corrector 354 corrects, according to user's input operation, the movement trajectory displayed on the display 33. More specifically, the corrector 354 corrects the movement trajectory according to a user's input operation (correction instruction) of moving a point on the movement trajectory displayed on the display 33 or the base 11 displayed on the display 33. That is, the user moves the point on the movement trajectory displayed on the display 33 or the base 11 displayed on the display 33, and accordingly, the corrector 354 corrects the movement trajectory. As one example, the input operation (the correction instruction) is an operation (instruction) of the user moving the point on the movement trajectory displayed on the display 33 or the base 11 displayed on the display 33 by drag-and-drop.

When the movement trajectories of the hand 13 and the arm 12 derived by the deriver 352 are determined, the movement program producer 355 produces a movement program causing the robot 10 to move based on the determined movement trajectories of the hand 13 and the arm 12. The produced movement program is transmitted to the robot control device 20. The robot control device 20 controls movement of the robot 10 based on the movement program received from the teaching device 30.

<Movement Trajectory Derivation Operation>

Figure 3:
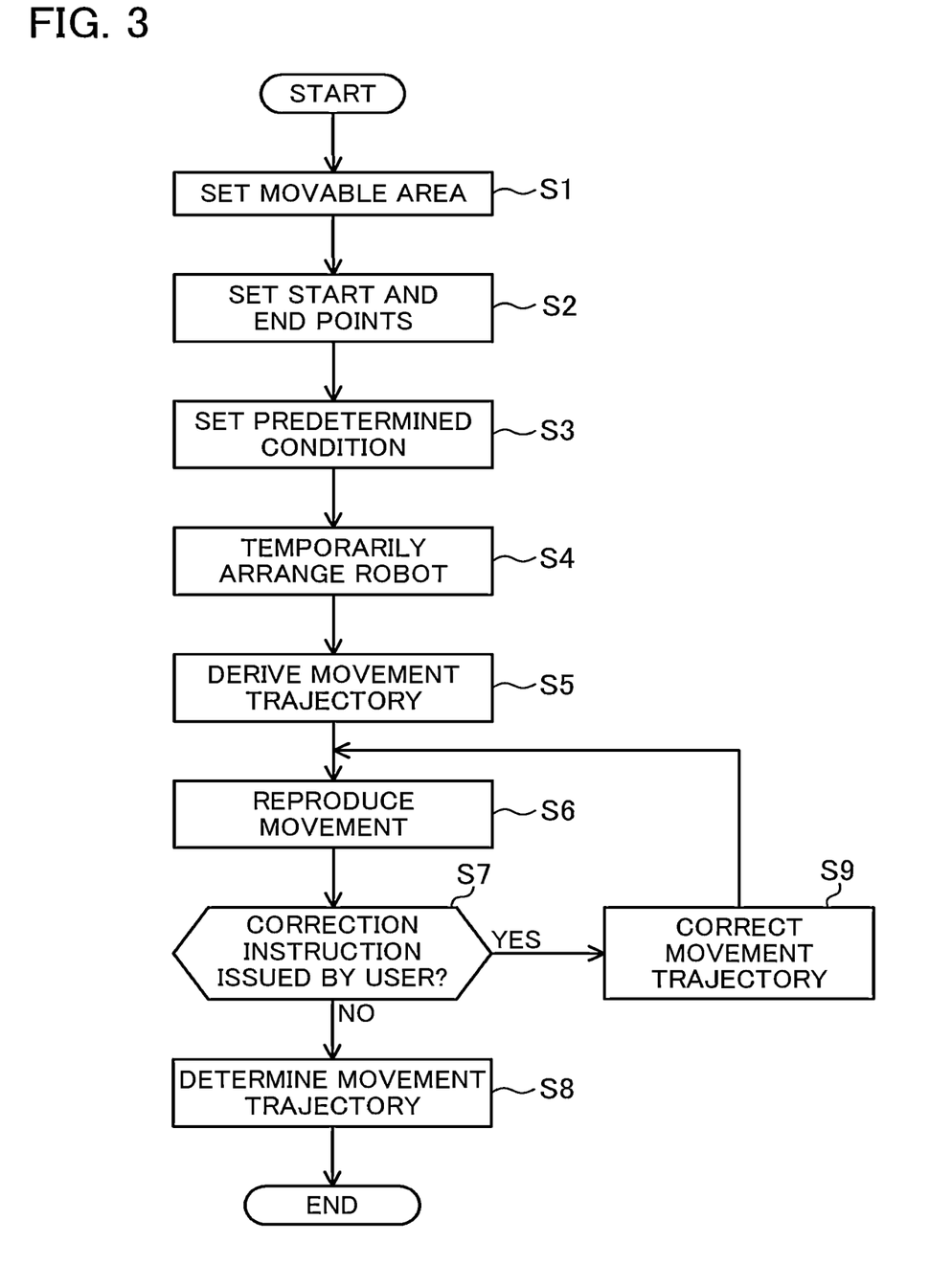
FIG. 3 is a flowchart showing movement trajectory derivation operation by the teaching device.

Movement trajectory derivation operation in the teaching device 30 (the processor 35) will be described with reference to a flowchart of FIG. 3.

First, in Step S1, the setter 351 sets a movable area of the robot 10. Specifically, the setter 351 sets movable areas of the arm 12 and the hand 13 according to the user's input operation via the inputter 31. In the present embodiment, the housing 2 (i.e., the delivery space 3) in which the robot 10 is present is set as the movable area.

Figure 4:
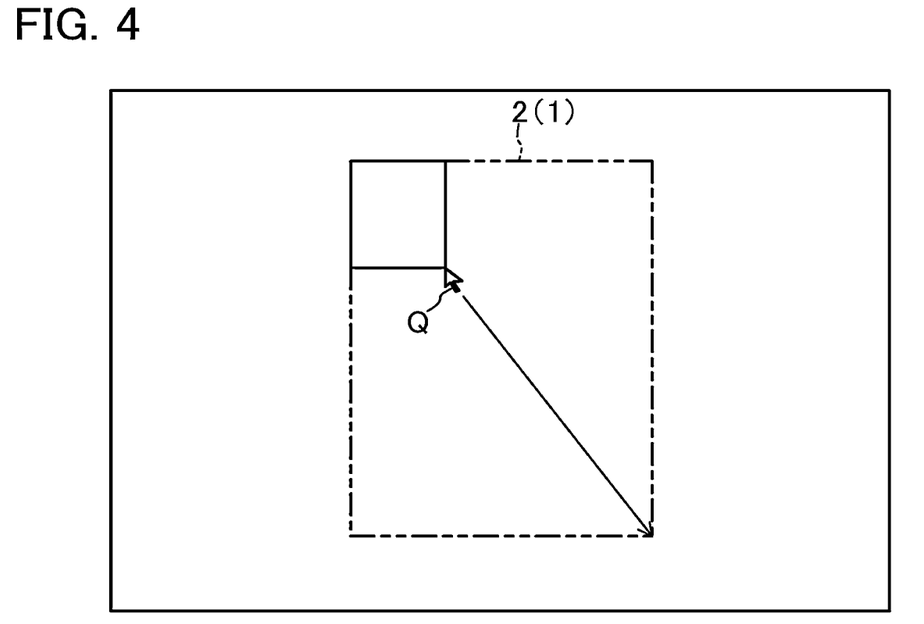
FIG. 4 is a view showing one example of an image displayed on a display.

As shown in FIG. 4, the user operates the mouse to move a mouse pointer Q from the upper left to the lower right on the display 33, thereby generating a rectangular frame-shaped model (hereinafter referred to as a housing 2) of the housing 2, for example. Accordingly, the setter 351 sets the housing 2 displayed on the display 33 as the movable area.

Note that the rectangular frame-shaped model of the housing 2 may be generated on the display 33 by input of a coordinate value via the keyboard by the user instead of the above-described mouse operation, for example. In this case, a coordinate input window is displayed on the display 33, and the user inputs the coordinate value to the coordinate input window, for example.

Subsequently, in Step S2, the setter 351 sets the start and end points of the hand 13. Specifically, the setter 351 sets, according to the user's input operation via the inputter 31, a plurality (four in the present embodiment) of teaching points P1 to P4 as the start and end points of the hand 13.

Figure 5:
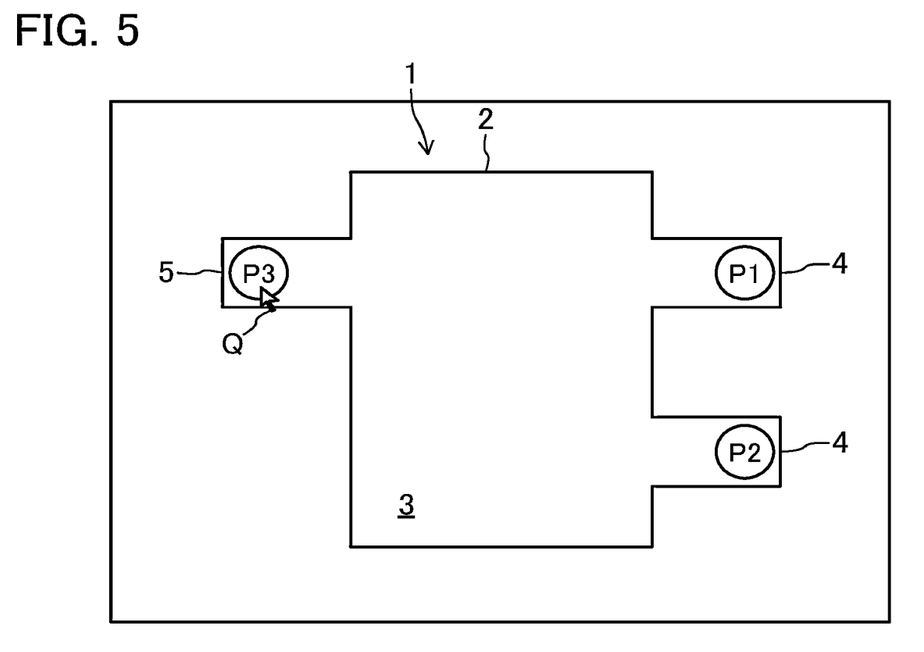
FIG. 5 is a view showing one example of the image displayed on the display.

As shown in FIGS. 5 and 6, the user operates the mouse to specify four teaching points P1 to P4 on the display 33. Although not shown in the figure, icons each indicating the teaching points P1 to P4 are displayed on the display 33. The user moves, with the pointer Q, the icons each indicating the teaching points P1 to P4 to predetermined positions on the display 33, thereby specifying the teaching points P1 to P4. In the present embodiment, the teaching point P1 is specified as the start point, and the teaching point P4 is specified as the end point, for example. By such user's input operation, the setter 351 sets the start and end points of the hand 13.

On the display 33, the user specifies the teaching points P1 to P4 as described above, and accordingly, models of the FOUPs 4 and the processing devices 5 are automatically generated. In the present embodiment, the FOUPs 4 are generated at the positions of the teaching points P1, P2, and the processing devices 5 are generated at the positions of the teaching points P3, P4. Note that also in Step S2, the user may specify the teaching points P1 to P4 on the display 33 by input of a coordinate value via the keyboard instead of mouse operation. Also in this case, when the teaching points P1 to P4 are specified, the models of the FOUPs 4 etc. are automatically generated on the display 33.

Subsequently, in Step S3, the setter 351 sets the predetermined condition (the movement condition) other than the above-described movable area and the above-described start and end points of the hand 13. The setter 351 sets the predetermined condition by the user's input operation via the inputter 31. The predetermined condition (the movement condition) includes, for example, the upper limit of the movement addition-subtraction speed (the acceleration and the deceleration in movement) of the hand 13, the upper limits of the speeds of the arm 12 and the hand 13, the upper limit of the number of passing points from the start point to the end point, and the available rotation angles of the links 12a, 12b.

As the upper limit of the addition-subtraction speed of the hand 13, different numerical values may be set between a state in which the substrate S is on the hand 13 and a state in which the substrate S is not on the hand 13. That is, when the substrate S is on the hand 13, the upper limit of the addition-subtraction speed is set lower than that when the substrate S is not on the hand 13. Further, the predetermined condition includes a condition where the arm 12 and the hand 13 do not contact, e.g., a wall of the housing 2. The user can select and input the above-described predetermined condition, as necessary.

Subsequently, in Step S4, the robot model of the robot 10 is temporarily arranged on the display 33. As shown in FIG. 6, the user operates the mouse to display the robot model on the display 33. Note that reference numerals similar to those of the robot 10 shown in FIG. 1 are assigned to the robot model shown in FIGS. 6 to 10. Then, the user operates the mouse to temporarily arrange, with the pointer Q, the base 11 of the robot 10 at an optional position on the display 33. Note that temporary arrangement of the robot 10 may also be performed by input of a coordinate value.

Subsequently, in Step S5, the deriver 352 derives the movement trajectory of the hand 13 from the start point (the teaching point P1) to the end point (the teaching point P4) and the movement trajectory of the arm 12 according to the movement trajectory of the hand 13 based on the predetermined condition set by the setter 351. Specifically, the deriver 352 starts the movement trajectory derivation operation when the user clicks, by mouse operation, an "optimization button" (not shown) displayed on the display 33, for example. The deriver 352 derives the movement trajectory of the hand 13 matching the predetermined condition and the movement trajectory of the arm 12 according to the movement trajectory of the hand 13 while changing the position of the base 11. In this manner, the movement trajectories of the hand 13 etc. are derived while the position of the base 11 is changed, and therefore, more-optimal movement trajectories are derived as compared to a case where a hand movement trajectory is derived with a base position fixed, for example.

Figure 7:
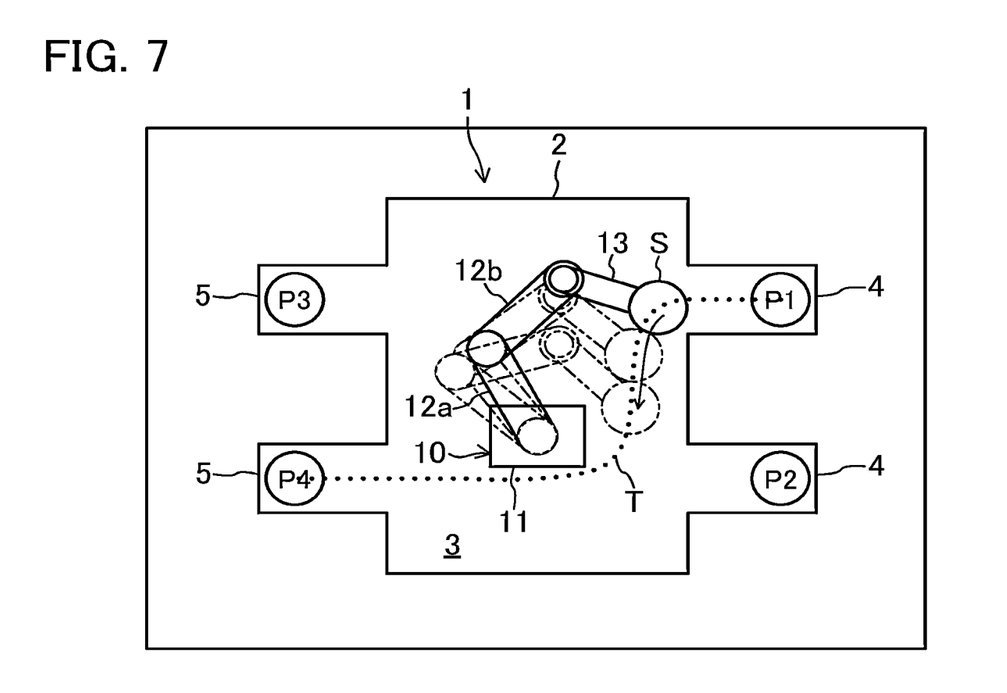
FIG. 7 is a view showing one example of the image displayed on the display.

Then, after the movement trajectories of the hand 13 etc. have been derived by the deriver 352, the display 33 displays at least one of the movement trajectory of the hand 13 or the movement trajectory of the arm 12, the movement trajectories being derived by the deriver 352. In the present embodiment, the display 33 displays, as one example, a movement trajectory T of the hand 13 from the start point (the teaching point P1) to the end point (the teaching point P4), as shown in FIG. 7. In this case, on the display 33, the robot 10 (the base 11) is arranged at a position employed as a parameter in derivation of the movement trajectory T of the hand 13.

The movement trajectory derived by the deriver 352 is displayed on the display 33 as described above so that the user can view the movement trajectory.

Subsequently, in Step S6, the reproducer 353 causes the robot 10 to move on the display 33 based on the movement trajectory T displayed on the display 33. Specifically, the reproducer 353 causes the robot 10 to move on the display 33 when the user clicks, by mouse operation, a "reproduction button" (not shown) displayed on the display 33, for example. As shown in FIG. 7, the reproducer 353 causes the arm 12 and the hand 13 to move on the display 33 such that the hand 13 moves along the movement trajectory T from the start point to the end point. That is, the reproducer 353 causes the arm 12 and the hand 13 to move on the display 33 based on the movement trajectories of the hand 13 and the arm 12 derived by the deriver 352. In this manner, the arm 12 and the hand 13 move based on the movement trajectory T on the display 33 so that the user can view movement of the arm 12 and the hand 13 based on the movement trajectory T.

Subsequently, in Step S7, the corrector 354 determines whether or not there has been a user's correction instruction. For example, in a case where the user views movement of the arm 12 and the hand 13 on the display 33 and feels that such movement is not proper or has a feeling of strangeness on such movement, the user issues an instruction to correct the movement trajectory T such that such movement is improved. For example, in a case where the arm 12 or the hand 13 seems to be extremely close to a wall of the housing 2 or seems to move in a wasteful manner, the user feels that such movement is not proper. That is, the user visually checks movement of the arm 12 and the hand 13, and determines whether or not the user issues the correction instruction.

In Step S7, in a case where there has been no user's correction instruction, i.e., a case where the user has determined that movement of the arm 12 and the hand 13 on the display 33 is proper (the user has no feeling of strangeness on movement of the arm 12 and the hand 13), the corrector 354 determines the movement trajectory T displayed on the display 33 as an optimal movement trajectory (Step S8). In this case, the corrector 354 also determines, as an optimal movement trajectory, the movement trajectory of the arm 12 derived by the deriver 352, i.e., the movement trajectory of the arm 12 according to the movement trajectory T of the hand 13.

Figure 8:
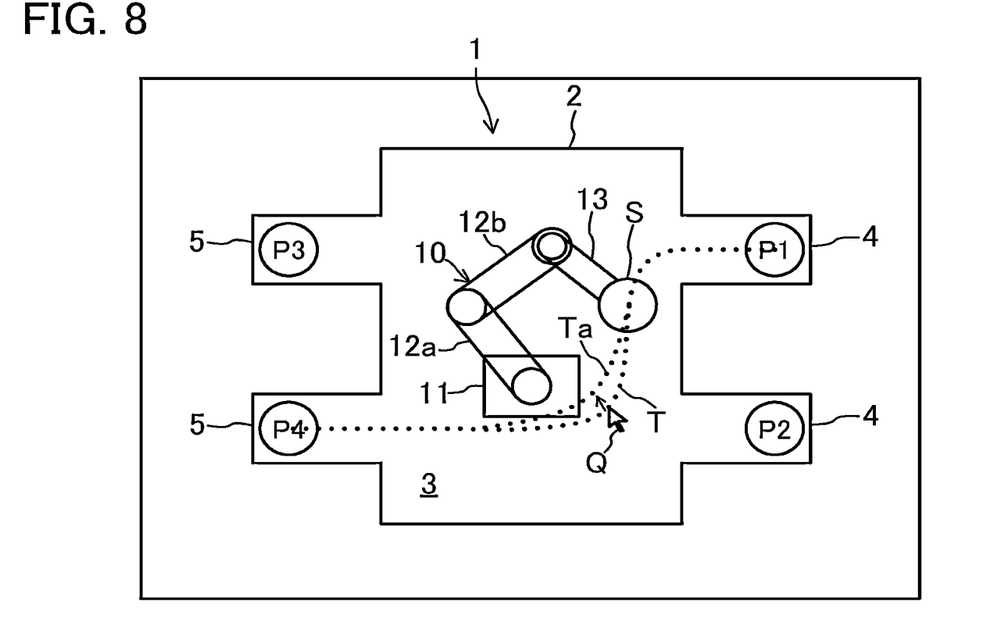
FIG. 8 is a view showing one example of the image displayed on the display.

In the present embodiment, in a case where the user has felt that movement of the arm 12 and the hand 13 on the display 33 is not proper (the user has a feeling of strangeness on movement of the arm 12 and the hand 13), the user performs an input operation (correction instruction) of moving a point on the movement trajectory T displayed on the display 33. Specifically, as shown in FIG. 8, the user operates the mouse to move the point on the movement trajectory T displayed on the display 33 to a desired position by drag-and-drop.

In a case where there has been the user's correction instruction in Step S7, the processing proceeds to Step S9. In Step S9, the corrector 354 corrects the movement trajectory T displayed on the display 33. Specifically, the corrector 354 corrects the movement trajectory T based on information on movement of the movement trajectory T according to the user's correction instruction, and displays a new corrected movement trajectory Ta on the display 33. In this case, the corrected movement trajectory Ta may be one obtained by correction of part of the pre-corrected movement trajectory T or one obtained by correction of the entirety of the pre-corrected movement trajectory T.

The corrector 354 corrects not only the movement trajectory T of the hand 13 displayed on the display 33, but also the movement trajectory of the arm 12. That is, the corrector 354 corrects the movement trajectory (i.e., the movement trajectory of the arm 12 according to the pre-corrected movement trajectory T of the hand 13) of the arm 12 derived by the deriver 352 to the movement trajectory of the arm 12 according to the corrected movement trajectory Ta of the hand 13.

As described above, the user can issue the correction instruction while viewing the movement trajectory T displayed on the display 33, and therefore, can more finely correct the movement trajectory T according to a user's intention. Moreover, the user can correct the movement trajectory T by an easy method of moving the point on the movement trajectory T displayed on the display 33.

After the corrector 354 has corrected the movement trajectory T in Step S9, the processing returns to Step S6 again, and the reproducer 353 causes the robot 10 to move on the display 33 based on the corrected movement trajectory Ta displayed on the display 33. That is, the reproducer 353 causes the arm 12 and the hand 13 to move on the display 33 such that the hand 13 moves along the corrected movement trajectory Ta from the start point to the end point. In other words, the reproducer 353 causes the arm 12 and the hand 13 to move on the display 33 based on the movement trajectories of the hand 13 and the arm 12 corrected by the corrector 354. In this manner, the arm 12 and the hand 13 move on the display 33 based on the corrected movement trajectory Ta so that the user can view movement of the arm 12 and the hand 13 based on the corrected movement trajectory Ta.

In a case where there has been the user's correction instruction in Step S7 again, i.e., in a case where the user has performed again an input operation (correction instruction) of moving a point on the corrected movement trajectory Ta displayed on the display 33, the processing proceeds to Step S9 again. That is, the flow from Step S9 to Step S6 is basically repeated as long as the user does not determine that movement of the arm 12 and the hand 13 reproduced by the reproducer 353 is proper. In other words, the user can continuously correct the movement trajectory of the hand 13 and the movement trajectory of the arm 12 until the user feels that movement of the arm 12 and the hand 13 reproduced by the reproducer 353 is proper.

In a case where there has been no user's correction instruction in Step S7, i.e., a case where the user has determined that movement of the arm 12 and the hand 13 based on the corrected movement trajectory Ta is proper (the user has no feeling of strangeness on movement of the arm 12 and the hand 13), the corrector 354 determines, as an optimal movement trajectory, the corrected movement trajectory Ta displayed on the display 33 (Step S8). In this case, the corrector 354 also determines, as an optimal movement trajectory, the corrected movement trajectory (i.e., the movement trajectory of the arm 12 according to the corrected movement trajectory Ta of the hand 13) of the arm 12. Then, the movement trajectory derivation operation ends.

The movement program producer 355 produces a movement program for controlling the robot 10 in an actual space based on the movement trajectories of arm 12 and the hand 13 determined by the processor 35. Then, the movement program producer 355 transmits the produced movement program to the robot control device 20 via the communicator 32. The robot control device 20 controls the robot 10 in the actual space based on the movement program received from the teaching device 30.

In this manner, the movement trajectory of the robot 10 in the actual space is optimized under the predetermined condition (the movement condition). For the robot 10 of this type, there has been a demand for shortening a movement time of the hand 13 from the start point to the end point as much as possible. If such a demand is not taken into consideration, the movement addition-subtraction speed of the hand 13 tends to be high, and for this reason, there is a probability that the substrate S drops from the substrate S. Particularly, in the case of the robot 10 that delivers the substrate S with the substrate S being on the upper surface of the hand 13 in an unfixed manner as in the present embodiment, the above-described probability becomes prominent. For this reason, the setter 351 sets the upper limit of the movement addition-subtraction speed of the hand 13 such that dropping of the substrate S is prevented, and accordingly, an optimal movement trajectory in which the movement time of the hand 13 is the shortest is derived within a range in which the substrate S does not drop from the hand 13.

As described above, the teaching device 30 of the embodiment is the teaching device for the robot 10 including the base 11, the arm 12 having the plurality of links 12a, 12b coupled to each other and coupled to the base 11, and the hand 13 (the end effector) coupled to the arm 12. The teaching device 30 includes the setter 351 that sets the predetermined condition including the start and end points of the hand 13 in the predetermined movement of the arm 12; the deriver 352 that derives the movement trajectory of the hand 13 from the start point to the end point and the movement trajectory of the arm 12 according to the movement trajectory of the hand 13 based on the predetermined condition; the display 33 that displays at least one of the movement trajectory of the arm 12 or the movement trajectory of the hand 13, the movement trajectories being derived by the deriver 352; and the corrector 354 that corrects the movement trajectory displayed on the display 33 according to the user's input operation.

The trajectory derivation program 341 of the embodiment is the teaching program for the robot 10 including the base 11, the arm 12 having the plurality of links 12a, 12b coupled to each other and coupled to the base 11, and the hand 13 (the end effector) coupled to the arm 12. The trajectory derivation program 341 causes the computer to execute a function of setting the predetermined condition including the start and end points of the hand 13 in the predetermined movement of the arm 12, a function of deriving the movement trajectory of the hand 13 from the start point to the end point and the movement trajectory of the arm 12 according to the movement trajectory of the hand 13 based on the predetermined condition, a function of displaying, on the display, at least one of the derived movement trajectory of the arm 12 or the derived movement trajectory of the hand 13, and a function of correcting the movement trajectory displayed on the display 33 according to the user's input operation.

According to these configurations, the user can issue the correction instruction (the input operation) while viewing the movement trajectory displayed on the display 33, and therefore, can more finely and easily correct the movement trajectory according to the user's intention.

The corrector 354 corrects the movement trajectory of the hand 13 according to the user's correction instruction (input operation) of moving the point on the movement trajectory of the hand 13 displayed on the display 33.

According to the above-described configuration, the user can finely correct the movement trajectory by an easy method of moving the point on the movement trajectory displayed on the display 33.

The display 33 further displays the robot model of the robot 10. The teaching device 30 further includes the reproducer 353 that causes the robot model to move on the display 33 based on the movement trajectory derived by the deriver 352.

According to the above-described configuration, the user can issue the correction instruction (the input operation) while viewing movement of the arm 12 and the hand 13 reproduced by the reproducer 353, and therefore, can more finely correct the movement trajectory according to the user's intention.

Particularly, the reproducer 353 causes the robot model (the hand 13 and the arm 12) to move in a state in which the movement trajectory T derived by the deriver 352 or the movement trajectory Ta corrected by the corrector 354 is displayed on the display 33. Thus, the user can clearly view a correspondence relationship between the movement trajectory T (the movement trajectory Ta) and movement of the robot model, and therefore, can more finely correct the movement trajectory T (the movement trajectory Ta) according to the user's intention.

The user's correction instruction (input operation) is an instruction of the user moving the point on the movement trajectory displayed on the display 33 by drag-and-drop.

According to the above-described configuration, the movement trajectory can be more easily corrected.

The robot 10 delivers the substrate S (the target) with the substrate S being on the upper surface of the hand 13 in an unfixed manner. The predetermined condition set by the setter 351 includes the upper limit of the movement addition-subtraction speed of the hand 13.

According to the above-described configuration, the optimal movement trajectory in which the movement time of the hand 13 from the start point to the end point is the shortest can be derived within the range in which the substrate S does not drop from the hand 13.

In the case of targeting the robot 10 having two hands 13 as the end effectors as in the above-described embodiment, the deriver 352 derives the movement trajectories of the hands 13 etc., taking also the postures of two hands 13 at the start and end points (i.e., the FOUP 4 and the processing device 5) into consideration. The postures of two hands 13 include, for example, a state in which the upper hand 13a enters the FOUP 4 and the lower hand 13b is rotated 90 degrees rightward or leftward without entering the FOUP 4, a state in which the lower hand 13b enters the FOUP 4 and the upper hand 13a is rotated 90 degrees rightward or leftward without entering the FOUP 4, and a state in which both the upper hand 13a and the lower hand 13b enter the FOUP 4. These postures of two hands 13 at the start and end points are taken into consideration so that more-optimal movement trajectories of the hands 13 etc. can be derived.

Other Embodiments

The embodiment has been described above as an example of the technique disclosed in the present application. However, the technique in the present disclosure is not limited to above, and is also applicable to embodiments to which changes, replacements, additions, omissions, etc. are made as necessary. The components described above in the embodiment may be combined to form a new embodiment. The components shown in the attached drawings and described in detail may include not only components essential for solving the problems, but also components that are provided for describing an example of the above-described technique and are not essential for solving the problems. Thus, description of these non-essential components in detail and illustration of these components in the attached drawings shall not be interpreted that these non-essential components are essential.

In the above-described embodiment, the deriver 352 may derive the movement trajectory of the hand 13 from the start point to the end point and the movement trajectory of the arm 12 according to the movement trajectory of the hand 13 while changing not only the position of the base 11 but also the lengths of the links 12a, 12b of the arm 12. According to this configuration, the movement trajectories of the hand 13 etc. are derived also taking the lengths of the links 12a, 12b as one parameter, and therefore, a more-optimal movement trajectory of the hand 13 and a more-optimal movement trajectory of the arm 12 can be derived. In other words, optimal lengths of the links 12a, 12b can be derived.

In the above-described embodiment, the deriver 352 may derive the movement trajectory of the hand 13 from the start point to the end point and the movement trajectory of the arm 12 according to the movement trajectory of the hand 13 while changing not only the position of the base 11 but also the orientation of the base 11 (i.e., the orientation of the robot 10). According to this configuration, the movement trajectories of the hand 13 etc. are derived also taking the orientation of the base 11 as one parameter, and therefore, a more-optimal movement trajectory of the hand 13 and a more-optimal movement trajectory of the arm 12 can be derived. In other words, an optimal orientation of the base 11 can be derived.

In the above-described embodiment, the deriver 352 may display both the derived movement trajectory of the hand 13 and the derived movement trajectory of the arm 12 on the display 33, or may display only the movement trajectory of the arm 12 on the display 33.

In the above-described embodiment, the corrector 354 may correct the movement trajectory according to a user's correction instruction (input operation) of moving the base 11 displayed on the display 33. In this case, the user issues the instruction by operating the mouse to move the base 11 displayed on the display 33 by drag-and-drop, for example.

Figure 9:
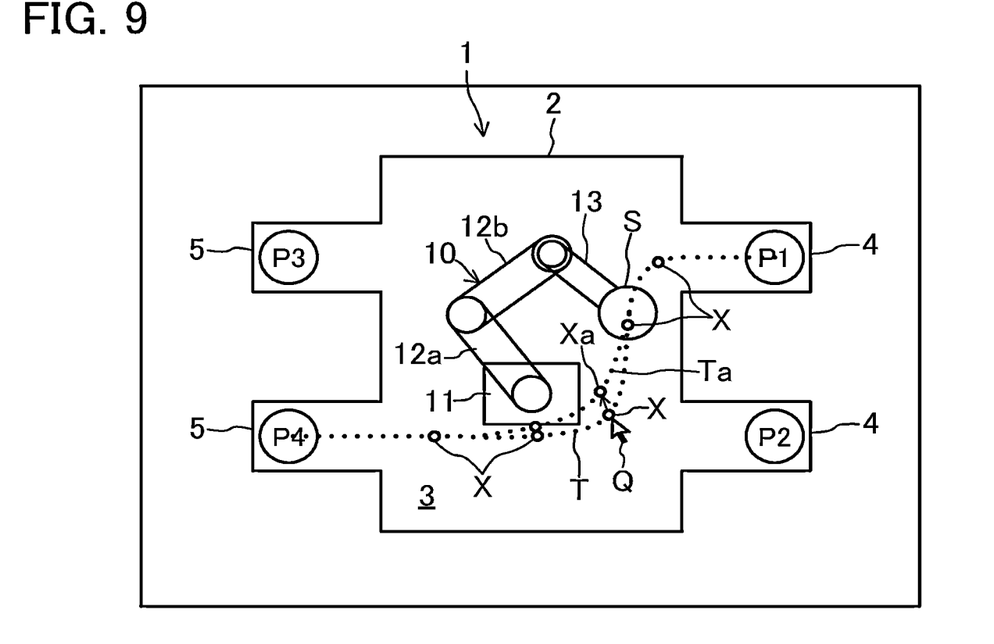
FIG. 9 is a view showing one example of the image displayed on the display.

In the above-described embodiment, the movement trajectory T derived by the deriver 352 may be a trajectory connecting a plurality of passing points X, as shown in FIG. 9. In this case, the point, which is moved according to the user's correction instruction (input operation), on the movement trajectory T is a passing point X. For example, in a case where the setter 351 has set "a plurality of passing points is present" as the predetermined condition, the deriver 352 derives an optimal movement trajectory T of the hand 13 including the plurality of passing points X, and displays such a movement trajectory on the display 33. For example, the passing point X is displayed larger than other points on the movement trajectory T.

In this case, in a case where the user has felt that movement of the arm 12 and the hand 13 reproduced by the reproducer 353 is not proper, the user issues a correction instruction (input operation) of moving the passing point X on the movement trajectory T displayed on the display 33 by drag-and-drop (see FIG. 9), for example. The corrector 354 corrects the movement trajectory T displayed on the display 33 according to this user's correction instruction. That is, the corrector 354 corrects the movement trajectory T based on information on movement of the passing point X according to the user's correction instruction, i.e., information on the position of a passing point Xa after movement of the passing point X, and displays the new corrected movement trajectory Ta on the display 33. The corrected movement trajectory Ta includes the moved passing point Xa.

According to this configuration, the user can simply grasp which point on the movement trajectory T displayed on the display 33 needs to be moved. Moreover, the number of points, which can be moved, on the movement trajectory T is decreased, and accordingly, a throughput necessary for correction by the corrector 354 can be reduced.

Figure 10:
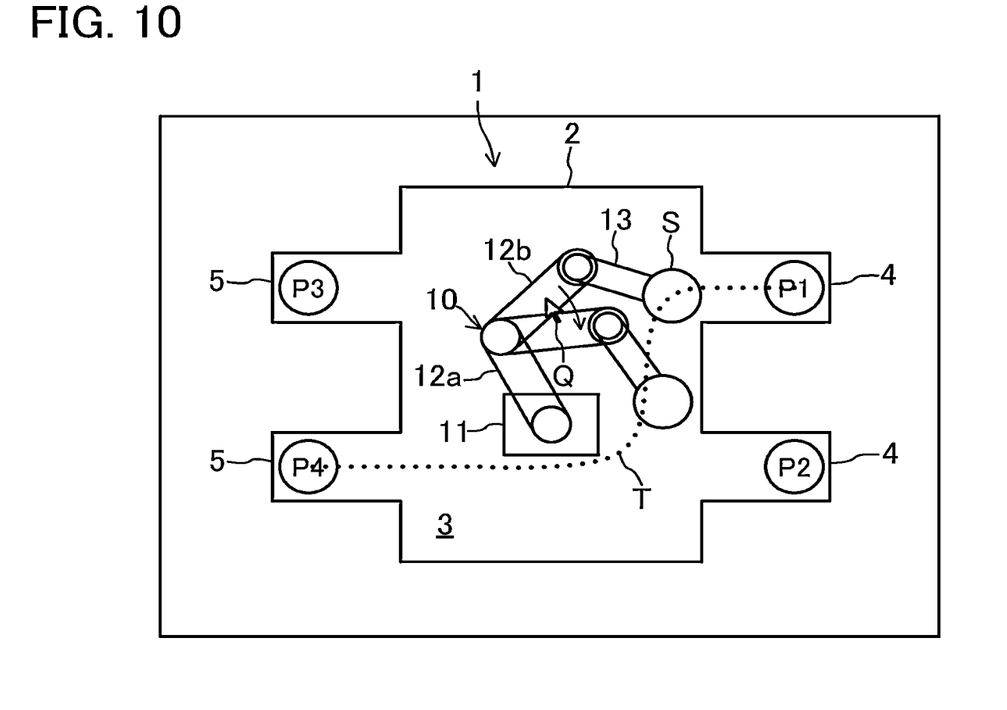
FIG. 10 is a view showing one example of the image displayed on the display.

In the above-described embodiment, the corrector 354 may correct the movement trajectory T displayed on the display 33 according to a user's correction instruction (input operation) of moving the arm 12 (i.e., the links 12a, 12b) displayed on the display 33. That is, as shown in FIG. 10, the user issues the correction instruction (input operation) by operating the mouse to move the second link 12b displayed on the display 33 by drag-and-drop. The corrector 354 corrects the movement trajectory T based on information on movement of the second link 12b according to the user's correction instruction, and displays a new corrected movement trajectory (not shown) on the display 33. For example, the above-described information on movement of the second link 12b includes information on the position of the second link 12b after movement and information on the position of the hand 13 moved in association with movement of the second link 12b.

In the above-described embodiment, the reproducer 353 may be omitted. In this case, the user determines whether or not a correction instruction is to be issued while viewing the movement trajectory displayed on the display 33.

The user's correction instruction (input operation) is not limited to operation via the mouse. For example, the user may input a coordinate value via the keyboard, thereby moving, e.g., the movement trajectory displayed on the display 33.

The reproducer 353 may cause the robot model (the hand 13 and the arm 12) to move in a state in which the movement trajectory T derived by the deriver 352 or the movement trajectory Ta corrected by the corrector 354 is not displayed on the display 33.

The deriver 352 may derive, with the position of the base 11 fixed, the movement trajectory of the hand 13 from the start point to the end point and the movement trajectory of the arm 12 according to the movement trajectory of the hand 13. In this case, in Step S4 as described above, the base 11 of the robot 10 is arranged at a predetermined position on the display 33 according to user's input operation.

The setter 351 may set the "presence or absence of the substrates S on two hands 13" as the predetermined condition. In this case, four condition patterns are set according to the presence or absence of the substrates S on two hands 13. That is, these four condition patterns include a condition where "the substrate S is on the upper hand 13a and no substrate S is on the lower hand 13b," a condition where "no substrate S is on the upper hand 13a and the substrate S is on the lower hand 13b," a condition where "the substrates S are on both the upper hand 13a and the lower hand 13b," and a condition where "no substrates S are on both the upper hand 13a and the lower hand 13b." The deriver 352 derives an optimal movement trajectory for each of these four condition patterns, and displays such a movement trajectory on the display 33. The user selects one movement trajectory from four movement trajectories, and as necessary, issues an instruction to correct the selected movement trajectory.

DESCRIPTION OF REFERENCE CHARACTERS

10 Robot
11 Base
12 Arm
12a First Link (Link)
12b Second Link (Link)
13 Hand (End Effector)
30 Teaching Device
33 Display
341 Trajectory Derivation Program (Teaching Program)
351 Setter
352 Deriver
353 Reproducer
354 Corrector
T Movement Trajectory
Ta Movement Trajectory
X Passing Point
Xa Passing Point

The invention claimed is:

1. A teaching device for a robot including a base, an arm having a plurality of links coupled to each other and coupled to the base, and an end effector coupled to the arm, comprising:
 a setter that sets a predetermined condition including start and end points of the end effector in predetermined movement of the arm;
 a deriver that derives a movement trajectory of the end effector from the start point to the end point and a movement trajectory of the arm according to the movement trajectory of the end effector based on the predetermined condition;
 a display that displays both the movement trajectory of the arm and the movement trajectory of the end effector, the movement trajectories being derived by the deriver; and
 a corrector that corrects the movement trajectory displayed on the display according to user's input operation, wherein
 the display displays both the corrected movement trajectory of the arm and the corrected movement trajectory of the end effector.

2. The teaching device for the robot according to claim 1, wherein
 the corrector corrects the movement trajectory according to an input operation of moving a point on the movement trajectory displayed on the display.

3. The teaching device for the robot according to claim 2, wherein
 the movement trajectory derived by the deriver is a path connecting a plurality of passing points, and
 the point, which is moved by the input operation, on the movement trajectory is the passing point.

4. The teaching device for the robot according to claim 1, the display further displaying a robot model of the robot, further comprising:
 a reproducer that causes the robot model to move on the display based on the movement trajectory derived by the deriver.

5. The teaching device for the robot according to claim 2, wherein
 the input operation is an operation of the user moving the point on the movement trajectory displayed on the display by drag-and-drop.

6. The teaching device for the robot according to claim 1, wherein
 the robot delivers a target with the target being on an upper surface of the end effector in an unfixed manner, and
 the predetermined condition includes an upper limit of a movement addition-subtraction speed of the end effector.

7. A teaching program for a robot including a base, an arm having a plurality of links coupled to each other and coupled to the base, and an end effector coupled to the arm, the teaching program causing a computer to execute
 a function of setting a predetermined condition including start and end points of the end effector in predetermined movement of the arm,
 a function of deriving a movement trajectory of the end effector from the start point to the end point and a movement trajectory of the arm according to the movement trajectory of the end effector based on the predetermined condition,
 a function of displaying, on a display, both the derived movement trajectory of the arm and the derived movement trajectory of the end effector, and
 a function of correcting the movement trajectory displayed on the display according to user's input operation, wherein
 the function of displaying, on the display, includes displaying both the corrected movement trajectory of the arm and the corrected movement trajectory of the end effector.

8. The teaching device for the robot according to claim 1, wherein when the start and end points are set, models of containers are automatically generated and displayed, on the display, at positions corresponding to the start and end points.

* * * * *